(12) United States Patent
Read

(10) Patent No.: US 6,434,243 B1
(45) Date of Patent: Aug. 13, 2002

(54) POWER AMPLIFIER

(76) Inventor: Clive William Warder Read, 19 Springfield Avenue, Telscombe Cliffs, Brighton, BN10 7AR (GB)

( * ) Notice: Subject to any disclaimer, the term of this patent is extended or adjusted under 35 U.S.C. 154(b) by 0 days.

(21) Appl. No.: 09/259,089

(22) Filed: Feb. 26, 1999

(51) Int. Cl.⁷ .............................................. H03R 21/00
(52) U.S. Cl. ...................... 381/120; 381/121; 330/285; 330/290
(58) Field of Search ................................ 381/120, 121; 330/285, 297, 296, 290

(56) References Cited

U.S. PATENT DOCUMENTS

| | | | | |
|---|---|---|---|---|
| 4,194,165 A | * | 3/1980 | Skulski | 381/120 |
| 5,847,610 A | * | 12/1998 | Fujita | 381/120 |
| 6,127,888 A | * | 12/2000 | Kokubo | 121/121 |

FOREIGN PATENT DOCUMENTS

GB   1257293   10/1978

* cited by examiner

*Primary Examiner*—Minsun Oh Harvey
(74) *Attorney, Agent, or Firm*—Vedder Price Kaufman & Kammholz

(57) ABSTRACT

An output stage for a power amplifier comprises an amplifying device T1 connected in series with a variable current sink T2 between positive and negative supply rails +/−V. A loudspeaker S is connected between the zero volt rail OV and a point intermediate the amplifying device T1 and the variable current sink T2. A feedback loop A1,A2 is provided for increasing the amount of current required by the variable current sink T2 as the amount of current delivered to the loudspeaker s by the amplifying device T1 falls. Thus, in one half cycle of the input signal Vin, the loudspeaker S is provided with current through the amplifying device T1 and in the other half cycle the variable current sink T2 draws current through the loudspeaker S. When no input is applied, the variable current sink T2 draws a low current and thus the output stage has an improved efficiency compared with conventional class A amplifiers. The voltage across the loudspeaker S is always controlled by the amplifying device T1 and thus cross over distortion will not occur.

8 Claims, 1 Drawing Sheet

POWER AMPLIFIER

BACKGROUND OF THE INVENTION

This invention relates to a power amplifier, and more particularly, but not solely to an audio power amplifier for driving a loudspeaker.

Audio power amplifiers are arranged to amplify a low level audio signal, say the output from a compact disc player, and to amplify it sufficiently to drive a loudspeaker. Known audio power amplifiers comprise a first, or so-called voltage gain, stage which amplifies the voltage and a second, or so-called, output stage, which amplifies the current sufficiently to drive a loudspeaker. The output power delivered to the loudspeaker is the product of the output voltage and output current.

In low power applications up to a few watts, the complete power amplifier is available as an inexpensive integrated circuit. However, for high power applications discrete components have to be used.

Loudspeakers are driven with an alternating current which varies between positive and negative values. Typically, the output stage of known power amplifiers comprises a pair of transistors which are arranged to conduct on respective half cycles of the input. A disadvantage of these so-called class B amplifiers is that cross-over distortion can occur as one transistor starts conducting and the other transistor stops conducting.

Single transistor output stages are known, however, these typically comprise an emitter follower and a constant current sink. These so-called class A amplifiers have the disadvantage that power is consumed even when no signal is applied to the input, although they do not suffer from cross-over distortion.

I have now devised an output stage for a power amplifier which alleviates the above-mentioned problems.

SUMMARY OF THE INVENTION

In accordance with this invention, there is provided an output stage for a power amplifier, the output stage comprising an amplifying device connected in series with a variable current sink between a pair of supply rails to which first and second voltage potentials are respectively applied, a load connected between a point intermediate the amplifying device and the variable current sink and a point to which a third potential is applied, said third potential lying between said first and second potentials, the circuit further comprising control means for increasing the amount of current required by the variable current sink as the amount of current delivered to the load by the amplifying device falls.

In one half cycle the load is provided with current through the amplifying device. In the other half cycle the variable current sink draws current through the load.

When no input is applied, the variable current sink draws a low current and thus the amplifier has an improved efficiency compared with conventional class A amplifiers. The voltage across the load is always controlled by the amplifying device and thus cross over distortion will not occur.

Preferably the variable current sink is controlled by a negative feedback loop which includes said current sink and said amplifying device Preferably the amplifying device comprises a single transistor.

Preferably the transistor comprises first, second and third terminals, said third terminal being arranged to control the amount of current flowing between said first and second terminals, the first of said supply rails being connected to said first transistor terminal via resistance means, said second transistor terminal being connected to the second of said supply rails by said current sink, the load being connected to said second transistor terminal. The feedback loop comprises an input connected from a point between said resistance means and said first transistor terminal to an amplifier whose output is connected to a control terminal of the current sink.

Preferably the current sink comprises a transistor having the first connected to the amplifying device, the second terminal connected via resistance means to the second supply rail, and the third terminal being arranged to control the amount of current flowing between the first and second terminals of the transistor of the current sink.

These and other objects, features and advantages of the present invention will be clearly understood through consideration of the following detailed description.

BRIEF DESCRIPTION OF THE DRAWINGS

An embodiment of this invention will now be described by way of example only and with reference to the accompanying drawings, in which.

DETAILED DESCRIPTION OF THE PREFERRED EMBODIMENTS

Figure 1:
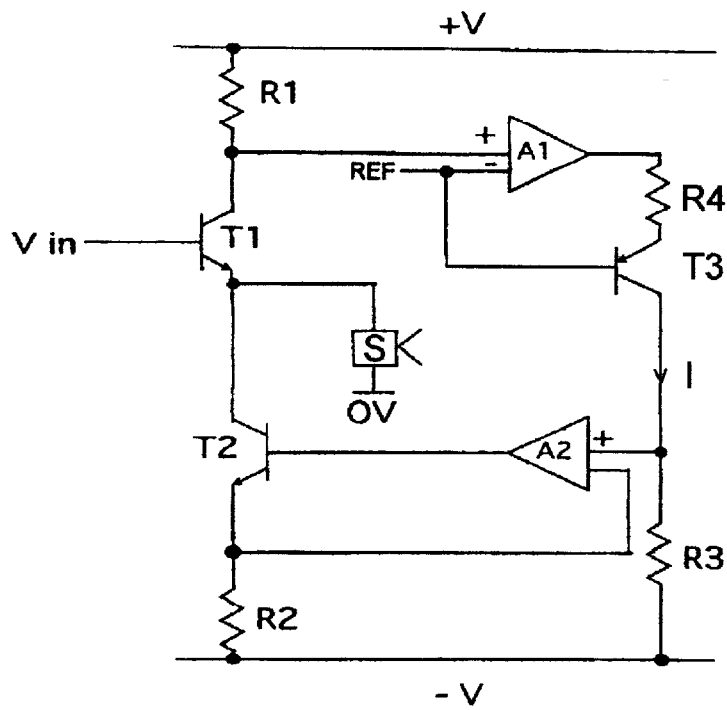
FIG. 1 is a general schematic diagram of the output stage of an audio power amplifier in accordance with this invention.

Referring to FIG. 1 of the drawings, there is shown the output stage of an audio power amplifier, the output stage comprising an input $V_{in}$ from a voltage gain stage (not shown).

The input $V_{in}$ is connected to the base of a npn bipolar transistor T1. The collector of T1 is connected to a positive supply rail+v by a resistor R1. The emitter of T1 is connected to the collector of a second npn bipolar transistor T2, which forms the variable current sink.

The emitter of T2 is connected to a negative supply rail–v via a resistor R2. A loudspeaker S is connected between a zero volt rail Ov and the emitter of T1 .

The collector of T1 is connected to the non-inverting input of an operational amplifier A1. The output of the operational amplifier A1 is connected to the emitter of a pnp bipolar transistor T3 via a resistor R4. The inverting input of the operational amplifier A1 is connected to the base of T3 and to a voltage reference. The collector of T3 is connected to the negative supply rail–v via a resistor R3. A second operational amplifier A2 has its non-inverting input connected to the collector of T3.

The output of the second operational amplifier A2 is connected to the base of T2 and the inverting input of the second operational amplifier A2 is connected to the emitter of T2 .

In use, the negative feedback loop comprising the operational amplifiers A1, A2, transistors T2 , T1 will force $V_{ref}$ across R1, thus determining the quiescent current when the input from the voltage gain stage is at zero and no current flows into the speaker S. Note that if the speaker were to be disconnected and a signal $V_{in}$ is applied, the feedback loop is unaffected, since T1 is working in grounded base and the voltage across R1 does not change.

If the speaker is reconnected and $V_{in}$ goes positive, the current for the speaker S flows through T1 from the positive rail+v. When this happens, the voltage across R1 increases, I reduces, the voltage across R3 and hence R2 reduces, thus reducing the current through T2.

If $V_{in}$ goes negative, the current through T1 reduces, the voltage across R1 reduces, I increases, the voltage across R3 and hence R2 increases, thus increasing the current through T2: this will continue until the voltage across R1 is again equal to $V_{ref}$, so the current flowing in T2 is increased as required and yet the current through T1 does not fall below the quiescent current. The output voltage is always controlled by T1 resulting in class A operation.

Figure 2:
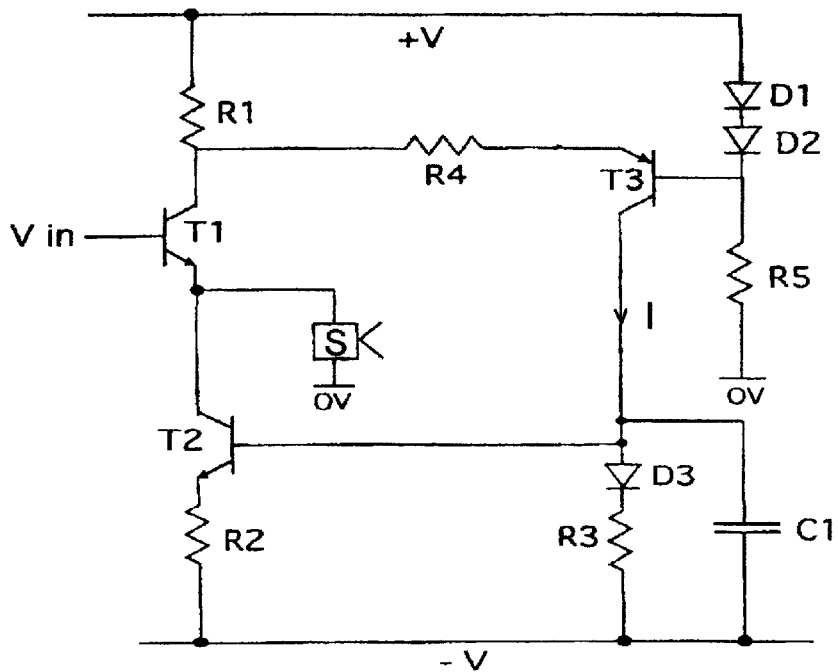
FIG. 2 is a specific detailed schematic diagram of the output stage of FIG. 1.

The most simple practical implementation of the circuit of FIG. 1 is shown in FIG. 2. The voltage gain stage providing $V_{in}$ should have a low output impedance, particularly at high frequencies, in order to main proper grounded base operation of T1 with respect to the current loop.

Let the quiescent current be set at one tenth of the peak output current, so for an output of 3 amps the quiescent is 300 mA giving R1=2 ohms. As R2 will drop 6 volts at 3 amps the supply will need to be 30 volts to be able to drive an 8 ohm speaker at 36 watts. The dissipation at quiescent is therefore only 18 watts compared with 144 watts for a conventional class A circuit.

If R2 is also 2 ohms, the gain round the current loop is approximately R3/R4 and if this is set to 10 the maximum current that T2 can sink will be 3 amps. Note that T2 is protected against short circuits on the output without any additional components being required.

R4 together with C1 defines the high frequency response of the current loop and must be chosen to allow the loop to slew at least as fast as $V_{in}$.

It will be appreciated that field-effect transistors or other amplifying devices could be used instead of the bipolar transistors shown in the drawings. Also, it will be appreciated that transistors of the opposite polarity type could be used.

While the preferred embodiment of the invention have been shown and described, it will be apparent to those skilled in the art that changes and modifications may be made therein without departing from the spirit of the invention, the scope of which is defined by the appended claims.

I claim:

1. An output stage for a power amplifier, the output stage comprising an amplifying device connected in series with a variable current sink between a pair of supply rails to which first and second voltage potentials are respectively applied, a load connected between a point intermediate the amplifying device and the variable current sink and a point to which a third potential is applied, said third potential lying between said first and second potentials, the circuit further comprising control means for increasing the amount of current required by the variable current sink as the amount of current delivered to the load by the amplifying device falls.

2. An output stage for a power amplifier as claimed in claim 1, in which said variable current sink is controlled by a negative feedback loop which includes said variable current sink and said amplifying device.

3. An output stage for a power amplifier as claimed in claim 2, in which the amplifying device comprises a single transistor.

4. An output stage for a power amplifier as claimed in claim 3, in which the transistor comprises first, second and third terminals, said third terminal being arranged to control the amount of current flowing between said first and second terminals, the first of said supply rails being connected to said first transistor terminal via resistance means, said second transistor terminal being connected to the second of said supply rails by said variable current sink, the load being connected to said second transistor terminal.

5. An output stage for a power amplifier as claimed in claim 4, in which the feedback loop comprises an input connected from a point between said resistance means and said first transistor terminal to an amplifier whose output is connected to a control terminal of said variable current sink.

6. An output stage for a power amplifier as claimed in claim 5, in which said variable current sink comprises a transistor having a first and second terminals respectively connected to the amplifying device and the second supply rail, said control terminal of the current sink being arranged to control the amount of current flowing between the first and second terminals of the transistor of said variable current sink.

7. An output stage for a power amplifier as claimed in claim 1, in which the amplifying device comprises a single transistor.

8. An output stage for a power amplifier as claimed in claim 7, in which the transistor comprises a first, second and third terminals, said third terminal being arranged to control the amount of current flowing between said first and second terminals, the first of said supply rails being connected to said first transistor terminal via resistance means, said second transistor terminal being connected to the second of said supply rails by said variable current sink, the load being connected to said second transistor terminal.

* * * * *

UNITED STATES PATENT AND TRADEMARK OFFICE
CERTIFICATE OF CORRECTION

PATENT NO.     : 6,434,243 B1
DATED          : August 13, 2002
INVENTOR(S)    : Clive William Warder Read It is certified that error appears in the above-identified patent and that said Letters Patent is hereby corrected as shown below:

<u>Title page,</u>
Please add the following :
-- [30]      Foreign Application Priority Data
       Feb. 27, 1998 (GB) ........................9804063.7 --

Signed and Sealed this

Fourth Day of February, 2003

JAMES E. ROGAN
*Director of the United States Patent and Trademark Office*